US009293908B2

(12) United States Patent
Valire

(10) Patent No.: US 9,293,908 B2
(45) Date of Patent: Mar. 22, 2016

(54) METHOD OF MEASUREMENT FOR DETECTING A FAULT OF A THREE-PHASE ZONE

(71) Applicant: ECE, Paris (FR)

(72) Inventor: Jérôme Jean-Louis Comeil Valire, Nogent S/Marne (FR)

(73) Assignee: ECE, Paris (FR)

( * ) Notice: Subject to any disclaimer, the term of this patent is extended or adjusted under 35 U.S.C. 154(b) by 161 days.

(21) Appl. No.: 13/860,045

(22) Filed: Apr. 10, 2013

(65) Prior Publication Data

US 2013/0301166 A1    Nov. 14, 2013

(30) Foreign Application Priority Data

Apr. 10, 2012    (FR) ...................... 12 53267

(51) Int. Cl.
H02H 7/06    (2006.01)
H02H 3/08    (2006.01)
H02H 3/28    (2006.01)
H02H 7/22    (2006.01)
G01R 31/00    (2006.01)

(52) U.S. Cl.
CPC . *H02H 3/08* (2013.01); *H02H 3/28* (2013.01); *H02H 7/222* (2013.01); *G01R 31/008* (2013.01)

(58) Field of Classification Search
CPC .................................. H02H 3/28; H02H 3/08
USPC ............................................................ 361/20
See application file for complete search history.

(56) References Cited

FOREIGN PATENT DOCUMENTS

| EP | 0384306 | 8/1990 |
|---|---|---|
| GB | 1037577 | 7/1966 |
| WO | 2005006000 | 1/2005 |

OTHER PUBLICATIONS

French search report for French patent application No. FR 1253267.

*Primary Examiner* — Erick Glass
(74) *Attorney, Agent, or Firm* — Meyertons, Hood, Kivlin, Kowert & Goetzel, P.C.; Eric B. Meyertons

(57) ABSTRACT

Method for protecting an electrical energy distribution box, the electrical energy distribution box comprising a set of distribution bars intended to be connected between a generator and loads, each of the bars being able to transfer at least a part of the electrical energy passing through it to at least one other bar of the set of bars. According to this method, the incoming and outgoing currents of a single distribution bar are measured and a fault in the set of bars is detected on the basis of the currents measured in the said bar.

11 Claims, 2 Drawing Sheets

METHOD OF MEASUREMENT FOR DETECTING A FAULT OF A THREE-PHASE ZONE

BACKGROUND OF THE INVENTION

1. Field of the Invention

The invention relates to protection and detection of an electrical fault and more particularly of an electrical fault in an electrical distribution box. The invention applies advantageously but in a nonlimiting manner to electrical distribution in an aircraft.

2. Description of the Relevant Art

The distribution of the electrical energy in an aircraft is very hierarchical. The power is firstly produced on the basis of generators driven by motors. Next, this energy is conveyed to primary-distribution boxes. The energy is then distributed by cables exiting the primary-distribution boxes either directly to loads or to secondary-distribution boxes.

A first so-called hierarchical protection is known from the prior art and which is fitted at the level of each cable which exits the primary-distribution and secondary-distribution boxes and at the level of the generator and of the first distribution box. This first protection comprises, at the output of the distribution boxes, an isolator, a fuse or an isolator contactor. These protection elements allow opening in the case of a current overload. This first protection furthermore comprises at the level of the generator and of the primary-distribution box a control means for the generator and a command means for a line contactor of the primary-distribution box. These protection elements allow respectively shutdown of the generator and the opening of the line contactor in the case of a current overload.

To allow selectivity, that is to say to allow the shutdown of the distribution at a necessary and sufficient rank of the distribution, the protection elements have different triggering delays. Their triggering delay depends on their rank in the distribution. For example, the triggering delay for a fuse of a cable at the output of a secondary-distribution box will be less than the triggering delay for the generator control means. This makes it possible for just the protection element located directly upstream of the electrical fault to trigger, the protection elements further upstream not triggering. Thus, the triggering delay for the generator control means may reach 5 seconds. This time is, however, long enough to cause damage.

A second so-called differential protection is also known from the prior art and which comprises a measurement of the current upstream and downstream of a distribution line. In the case of absence of fault, the two measurements of current are equal. In the case of a fault, the current is different and it will be possible to locate this fault easily since it is located between the two measurement points. This protection is for example used to protect the cables of the generator. On the other hand this protection cannot easily be used to detect an internal short-circuit of a distribution box since a measurement is then necessary on each of the distribution lines emanating from the distribution box. Considering the number of lines which has to be measured and the disparity of the sensors used, high inadvertent risks of triggering the protection exist.

SUMMARY OF THE INVENTION

According to the invention, is proposed a new type of protection which is aimed at alleviating the drawbacks of the protections mentioned hereinabove.

According to a first aspect, what is proposed is a method for protecting a distribution box comprising a set of distribution bars intended to be connected between a generator and loads, each of the bars being able to transfer at least a part of the electrical energy passing through it to at least one other bar of the set of bars.

According to a general characteristic of this method, the incoming and outgoing currents of a single electrical energy distribution bar are measured and a fault in the set of bars is detected on the basis of the currents measured in the said bar.

It is thus possible to detect on the basis of the currents measured in a single bar the faults of the entire set of bars and notably the faults of each of the bars of the set of bars. It is therefore possible to reduce the number of sensors and simplify the electronic circuit implementing the protection. This makes it possible to avoid inadvertent detections. Moreover, the fault isolation delay can be reduced, thereby making it possible to limit the damage caused by the fault.

According to one implementation, the set of distribution bars comprises three distribution bars. The incoming and outgoing currents are then measured on the bar located between the other bars.

Thus, the fault is detected all the more quickly as the measurement is performed on the bar on which the probability is highest that an electrical arc forms first.

The distribution box advantageously has an electrical ground able to transfer at least a part of its electrical energy to the set of distribution bars. A ground fault is detected by measuring the incoming and outgoing currents on a single bar of the set of bars.

Thus, it is also possible to detect ground faults on the basis of the measurement of current in a single bar.

The distribution box can furthermore comprise upstream and downstream of each of the distribution bars contactors. It is then possible to open at least one of said contactors when a fault is detected in the set of bars.

Thus, in the case of the detection of a fault, it is simple to open these line contactors so as to protect the generator and the entire distribution box.

According to one mode of implementation, the generator is controlled by a control means, and shutdown of the generator is triggered when a fault is detected in the set of bars.

It is also possible as a very last resort to trigger shutdown of the generator.

According to yet another characteristic of the protection method, the distribution bars of the set of bars extend in parallel over their whole length and are separated by one same distance of one to thirty millimeters.

According to another aspect, there is proposed a protection system for an electrical fault for electrical energy distribution box comprising a set of distribution bars intended to be connected between a generator and loads to be supplied, each of the bars of the set being able to transfer at least a part of the electrical energy passing through it to at least one other bar of the set of bars.

According to a general characteristic, this system comprises means for measuring current disposed upstream and downstream of a single distribution bar and processing means adapted for comparing the currents measured by the measuring means.

It is thus possible with this system to detect the faults of each of the bars of the set of bars on the basis of the currents measured on a single bar.

According to one embodiment, the set of distribution bars comprises three distribution bars, the means for measuring current being disposed upstream and downstream of the bar located between the other bars.

According to one embodiment, the distribution box has an electrical ground able to transfer at least a part of its electrical energy to the set of distribution bars.

According to another characteristic, the system comprises upstream and downstream of each of the distribution bars contactors and command means adapted for opening at least one of said contactors.

The system can furthermore comprise a control means adapted for controlling shutdown of the generator.

According to one embodiment, the distribution bars of the set of bars extend in parallel over the whole of their length and are separated by one same distance of one to thirty millimeters.

BRIEF DESCRIPTION OF THE DRAWINGS

Other advantages and characteristics of the invention will be apparent on examining the detailed description of a wholly non-limiting embodiment and the appended drawings in which.

Figure 1:
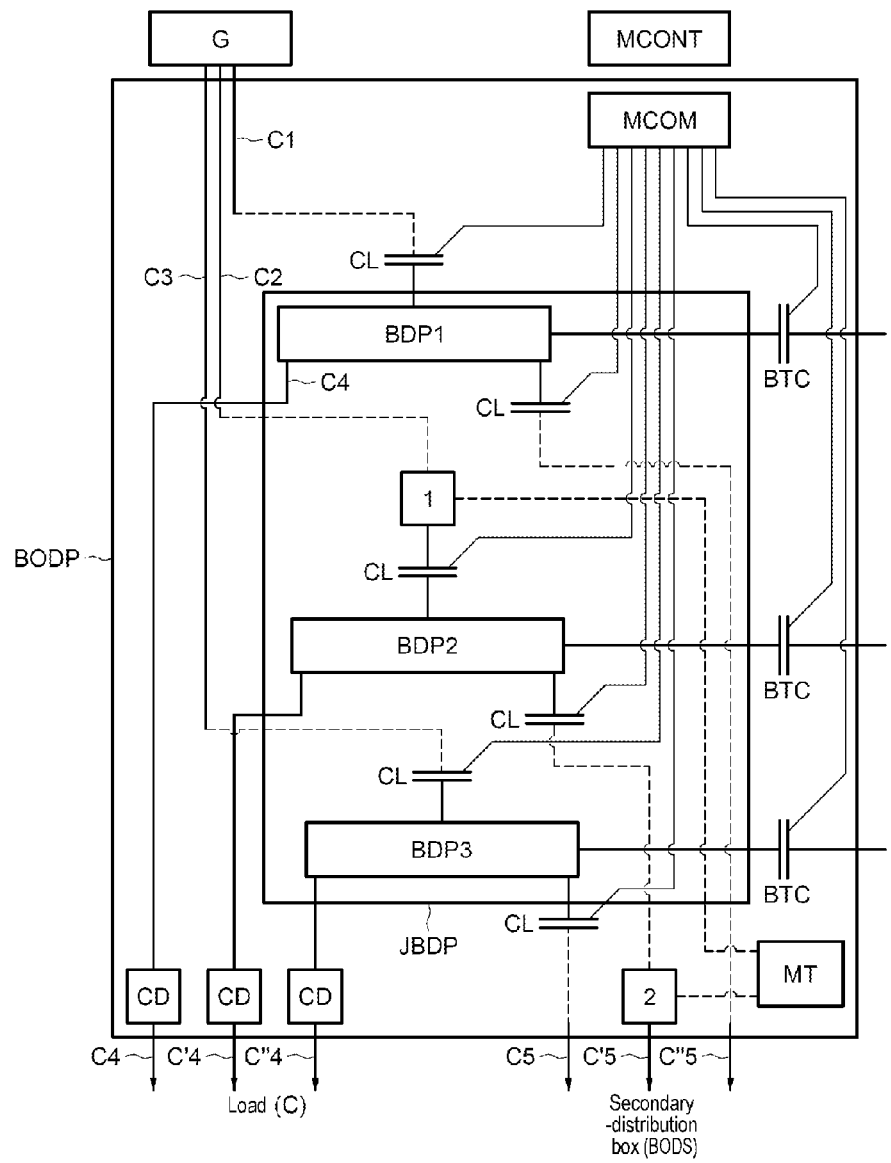
FIG. 1 illustrates in a schematic manner a primary-distribution box provided with an electrical protection system according to the invention.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

In FIG. 1 has been represented a primary-distribution box intended, in the exemplary application envisaged, to be embedded onboard an aircraft so as to provide electrical energy to loads or to secondary-distribution boxes via the onboard network.

As seen in this figure, the primary-distribution box is supplied by a generator G controlled by a control means MCONT. The primary-distribution box BODP comprises a set of bars JBDP which ensure the distribution of the current delivered by the generator and which here comprise three primary-distribution bars BDP1, BDP2, BDP3, in the case of a three-phase current. The generator G is linked to each of the three bars by means of three cables C1, C2 and C3.

Each of the bars BDP1, BDP2, BDP3 is linked to the downstream part of the distribution network via two cables C4 and C5, C'4 and C'S, C"4 and C"5. By way of exemplary embodiment, the first cable of each bar is linked directly to a load C of the aircraft while the second cable is linked to a secondary-distribution box BODS.

The protection system for such a primary-distribution box BODP comprises six line contactors CL. Three contactors are located on the upstream cables C1, C2 and C3 between each of the bars BDP1, BDP2, BDP3 and the generator and three contactors are located on the downstream cables C5, C'S and C"5 between each of the bars BDP1, BDP2, BDP3 and the secondary-distribution box BODS.

Each of the bars BDP1, BDP2, BDP3 is also linked to another primary-distribution box via contactors BTC. These contactors are of "Bus Tie Contactor" type according to a term well known to the person skilled in the art.

The protection system furthermore comprises three isolator contactors CD located on the downstream cables between each of the bars BDP1, BDP2, BDP3 and the load C of the aircraft.

According to other embodiments, the isolator contactor CD can be replaced with an isolator or a fuse. The isolator contactor CD allows an opening of the supply current for the load C in the case of a current overload. The isolator contactor CD could also be replaced with a line contactor CL.

The protection system further comprises command means MCOM. The command means MCOM are configured to open or close each of the line contactors CL, isolator contactors CD and contactors BTC for example if an electrical fault is detected.

To detect an electrical fault, the distribution box BODP comprises upstream and downstream of only one bar of the set JBDP, two current sensors respectively 1 and 2. These two sensors are here configured to measure the incoming and outgoing current entering and leaving the bar referenced BDP2.

The processing of these two measurements is ensured by a processing means MT. This processing means is for example embodied on the basis of hardware and/or software means and essentially ensures a comparison of the measured currents. In the case where the two measured currents are equal, then no fault is detected. On the other hand in the case where the two currents are different then a fault is detected.

As a function of the detection of the electrical fault, actions are taken by the protection system. For example in the case of detection of a fault, the command means MCOM dispatch to all the contactors CL an opening command so as to avoid the propagation of the electrical fault. Provision may also be made in the case of detection of an electrical fault for the control means MCONT to trigger shutdown of the generator.

Figure 2:
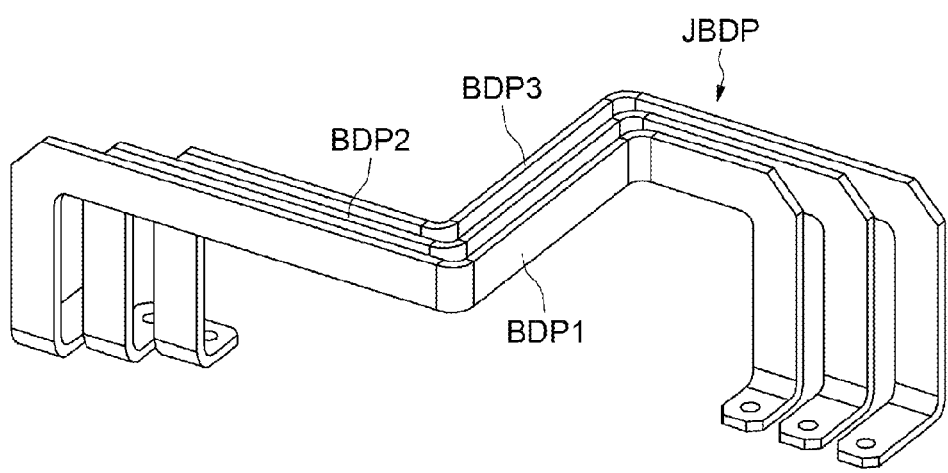
FIG. 2 illustrates in a schematic manner a set of bars implementing an electrical protection method according to the invention.

In fact, by measuring the incoming and outgoing currents on just a single bar, it is possible to detect a fault on the entire bar set as explained with reference to FIG. 2 which represents in a schematic manner an example of bars of a set of bars of the distribution box BODP.

As may be seen, the three bars BDP1, BDP2, BDP3 run substantially in parallel over the whole of their length, with a fixed inter-bar distance. Thus, it has been found that this geometry is such that each of the bars BDP1, BDP2, BDP3 of the set JBDP is able to transfer at least a part of the electrical energy passing through it to at least one other bar BDP1, BDP2, BDP3 of the set of bars JBDP.

Accordingly, only a small space between each of the bars is required, for example between 1 and 30 millimeters. The person skilled in the art will know how to choose this spacing in an advantageous manner while allowing operation of the primary-distribution box BODP.

Thus, if an electrical fault for example a leakage current or an arc fault exists on one of the bars, the geometry of the bars will also make it appear on the other two bars. It is therefore possible to protect the entire set of bars by measuring the difference between the incoming and outgoing current on just a single bar.

Likewise, the electrical ground fault of the electrical distribution box will be able to be detected by measuring just the incoming and outgoing current on a primary-distribution bar. Indeed, in the case where the set of bars is not too far from the ground of the box, the ground is able to transfer at least a part of its electrical energy to at least one other bar BDP1, BDP2, BDP3 of the set of bars JBDP.

Advantageously, the incoming and outgoing currents are measured on the middle bar BDP2 of the set JBDP. Indeed, in the case of an arc fault, the electrical arc will more probably form first on this middle bar, given its position.

The invention thus makes it possible to reduce the number of sensors, and to improve the reliability of the detection of an electrical fault. The complexity of the electronics is also decreased and the fault isolation time can be reduced, thereby making it possible to limit the damage caused by the fault.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. Method for protecting an electrical energy distribution box, the electrical energy distribution box comprising a set of distribution bars intended to be connected between a generator and loads, each of the bars being able to transfer at least a part of the electrical energy passing through it to at least one other bar of the set of bars, wherein the method comprises measuring the incoming and outgoing currents of a single distribution bar and detecting a fault in any one of the distribution bars of the set of bars on the basis of the currents measured in the said single distribution bar.

2. Method according to claim 1, wherein the set of distribution bars comprises three distribution bars, and wherein the incoming and outgoing currents are measured on a bar located between the other two bars.

3. Method according to claim 1, wherein the distribution box has an electrical ground able to transfer at least a part of its electrical energy to the set of distribution bars and in which a ground fault is detected by measuring the incoming and outgoing currents on a single bar of the set of bars.

4. Method according to claim 1, wherein the distribution box comprises upstream and downstream of each of the distribution bars contactors, and wherein at least one of the said contactors is opened when a fault is detected in the set of bars.

5. Method according to claim 1, wherein the generator is controlled by a control means, and shutdown of the generator is triggered when a fault is detected in the set of bars.

6. Method according to claim 1, wherein the distribution bars of the set of bars extend in parallel over their whole length and are separated by one same distance of one to thirty millimeters.

7. System for protecting an electrical energy distribution box the electrical energy distribution box comprising a set of distribution bars comprising distribution bars intended to be connected between a generator and loads, each of the bars of the set being able to transfer at least a part of the electrical energy passing through it to at least one other bar of the set of bars, wherein the system comprises means for measuring current disposed upstream and downstream of a single distribution bar and processing means adapted for comparing the currents measured by the measuring means and to detect a fault in any one of the distribution bars of the set of bars on the basis of the currents measured in the said single distribution bar.

8. System according to claim 7, wherein the set of distribution bars comprises three distribution bars, and wherein the means for measuring current are disposed upstream and downstream of a bar located between the other two bars.

9. System according to claim 7, wherein the distribution box has an electrical ground able to transfer at least a part of its electrical energy to the set of distribution bars.

10. System according to claim 7, further comprising, upstream and downstream of each of the distribution bars, contactors and command means adapted for opening at least one of said contactors.

11. System according to claim 7, further comprising a control means configured for controlling shutdown of the generator.

* * * * *